United States Patent
Franza et al.

(10) Patent No.: US 9,298,967 B2
(45) Date of Patent: Mar. 29, 2016

(54) FINGER BIOMETRIC SENSING DEVICE INCLUDING DRIVE SIGNAL NULLING CIRCUITRY AND RELATED METHODS

(71) Applicant: Apple Inc., Cupertino, CA (US)

(72) Inventors: Gordon S. Franza, Cupertino, CA (US); Gregory T. Minteer, Cupertino, CA (US); Jerry G. Dooley, Cupertino, CA (US); Patrick J. Landy, Cupertino, CA (US); Dale R. Setlak, Cupertino, CA (US); Giovanni Gozzini, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 215 days.

(21) Appl. No.: 13/886,554

(22) Filed: May 3, 2013

(65) Prior Publication Data

US 2013/0294662 A1 Nov. 7, 2013

Related U.S. Application Data

(60) Provisional application No. 61/642,832, filed on May 4, 2012.

(51) Int. Cl.
| | |
|---|---|
| *G06F 3/041* | (2006.01) |
| *G06K 9/00* | (2006.01) |
| *G06F 3/038* | (2013.01) |
| *G06F 3/044* | (2006.01) |
| *H03G 3/30* | (2006.01) |

(52) U.S. Cl.
CPC ............. *G06K 9/0002* (2013.01); *G06F 3/038* (2013.01); *G06F 3/044* (2013.01); *H03G 3/3084* (2013.01)

(58) Field of Classification Search
CPC ....... G06F 3/044; G06F 3/038; G06K 9/0002; H03G 3/3084
USPC .......................................... 345/173
See application file for complete search history.

(56) References Cited

U.S. PATENT DOCUMENTS

| | | | |
|---|---|---|---|
| 5,940,526 A | 8/1999 | Setlak et al. | |
| 5,953,441 A | 9/1999 | Setlak | |
| 5,963,679 A | 10/1999 | Setlak | |
| 6,067,368 A | 5/2000 | Setlak et al. | |
| 6,088,471 A | 7/2000 | Setlak et al. | |
| 6,289,114 B1 | 9/2001 | Mainguet | |
| 6,628,812 B1 * | 9/2003 | Setlak et al. | 382/124 |
| 6,927,581 B2 | 8/2005 | Gozzini | |
| 7,361,919 B2 | 4/2008 | Setlak | |
| 7,505,613 B2 | 3/2009 | Russo | |
| 7,697,281 B2 | 4/2010 | Dabov et al. | |
| 7,697,729 B2 | 4/2010 | Howell et al. | |
| 7,715,593 B1 | 5/2010 | Adams et al. | |

(Continued)

*Primary Examiner* — Jonathan Boyd
(74) *Attorney, Agent, or Firm* — Allen, Dyer, Doppelt, Milbrath & Gilchrist, P.A.

(57) ABSTRACT

A finger biometric sensing device may include drive circuitry capable of generating a drive signal and an array of finger biometric sensing pixel electrodes cooperating with the drive circuitry and capable of generating a detected signal based upon placement of a finger adjacent the array of finger biometric sensing pixel electrodes. The detected signal may include a relatively large drive signal component and a relatively small sense signal component superimposed thereon. The finger biometric sensing device may also include a gain stage coupled to the array of finger biometric sensing pixel electrodes, and drive signal nulling circuitry coupled to the gain stage capable of reducing the relatively large drive signal component from the detected signal.

23 Claims, 8 Drawing Sheets

(56) References Cited

U.S. PATENT DOCUMENTS

| | | |
|---|---|---|
| 7,734,068 B2 | 6/2010 | Fisher |
| 7,809,168 B2 | 10/2010 | Abiko et al. |
| 8,005,276 B2 | 8/2011 | Dean et al. |
| 8,145,916 B2 | 3/2012 | Boshra et al. |
| 2003/0123714 A1 | 7/2003 | O'Gorman et al. |
| 2004/0230810 A1 | 11/2004 | Hillhouse |
| 2008/0158172 A1 | 7/2008 | Hotelling et al. |
| 2008/0158178 A1* | 7/2008 | Hotelling et al. ............ 345/173 |
| 2008/0162751 A1 | 7/2008 | Wilson |
| 2008/0219522 A1 | 9/2008 | Hook |
| 2009/0083850 A1 | 3/2009 | Fadell et al. |
| 2009/0123039 A1* | 5/2009 | Gozzini ..................... 382/124 |
| 2009/0316963 A1 | 12/2009 | Boshra |
| 2010/0082444 A1 | 4/2010 | Lin et al. |
| 2010/0321158 A1 | 12/2010 | Setlak et al. |
| 2011/0102569 A1 | 5/2011 | Erhart |
| 2011/0175703 A1 | 7/2011 | Benkley, III |
| 2012/0085822 A1 | 4/2012 | Setlak et al. |
| 2012/0134549 A1 | 5/2012 | Benkley, III |
| 2012/0293442 A1 | 11/2012 | Westerman et al. |
| 2013/0315451 A1 | 11/2013 | Franza et al. |

\* cited by examiner

FINGER BIOMETRIC SENSING DEVICE INCLUDING DRIVE SIGNAL NULLING CIRCUITRY AND RELATED METHODS

RELATED APPLICATION

This application claims the benefit of a related U.S. Provisional Application Ser. No. 61/642,832, filed May 4, 2012, entitled "SYSTEM FOR MEASURING FINGERPRINTS AT A DISTANCE FROM THE FINGERPRINT SENSOR USING HIGHER VOLTAGE ELECTRIC FIELDS," the disclosure of which is incorporated by reference herein in its entirety.

FIELD OF THE INVENTION

The present invention relates to the field of electronics, and, more particularly, to finger biometric sensing devices and related methods.

BACKGROUND OF THE INVENTION

Fingerprint sensors that measure the fingerprint pattern using electric field sensing methods have become established. U.S. Pat. Nos. 5,940,526 and 5,963,679, assigned to the assignee of the present application, are examples of this type of fingerprint sensor, and the entire contents of which are incorporated herein by reference. These systems measure the fingerprint pattern by establishing an electric field between the finger and the sensor array, and measuring the spatial fluctuations in field strength at the sensor array caused by the shape of the fingerprint ridge and valley pattern.

In some recent applications, the sensor may desirably capture images of fingerprint patterns from fingers that are farther away from the sensor array than is typical with today's technologies. Unfortunately, as the finger gets farther away from the sensor array (for example when a relatively thick dielectric lies between the sensor array and the finger) the spatial field strength variations that represent the fingerprint pattern become weaker. One way to compensate for this loss of spatial pattern strength is to increase the voltage of the signals that generate the field between the finger and the sensor array. The fingerprint spatial pattern strength increases proportionately.

There may be limitations, however, on how much voltage can be placed on the finger and on the sensor array as well. When the voltages on the finger are too high, certain persons with very sensitive fingers may feel that voltage as a slight tingling. This may be undesirable in a consumer product. On the other hand, when voltages are too high on the sensor array, the sensor readout electronics may not perform adequately, for example, they may saturate and generate unacceptable noise, and may even be damaged.

U.S. Pat. No. 5,940,526 describes a system where a drive voltage is impressed on the finger (through a finger drive electrode) and the sensor array reference is connected to a device ground. The electric field is established between the voltage on the finger and a grounded sensor reference plane in arrangements known as driven finger systems. This system works well for imaging fingers over shorter distances. However, the human body has an inherent capacitance to earth ground, hence when a voltage is impressed on the finger, current flows through the finger and body to that ground. When the voltage on the finger is increased, people with sensitive fingers may feel that ground current as a tingling sensation.

U.S. Pat. No. 5,963,679 describes a sensor where a drive voltage is impressed on a reference electrode positioned beneath the sensing array elements, while the finger is connected to the system ground (through a finger drive electrode), in arrangements known as driven sensor systems. This system may work well for imaging fingers over short distances; and for those systems, it maintains the finger voltage close to ground.

However two circuit related problems may currently limit this implementation. First, the small spatial voltage differences representing the ridge-valley pattern are now riding on top of a relatively large common mode voltage from the nearby reference electrode, making measurement of the small spatial voltage differences difficult. Second, the sensor readout electronics, fabricated with standard economical CMOS devices, may not work properly if the voltages on the sensor array exceed the operating range of those devices.

In other words, the detected signals generated from the sensor array and based upon placement of the user's finger adjacent the sensor array are relatively small compared to the drive signal. Thus, these relatively small detected signals may be increasingly difficult to process along with the relatively high drive signal, limiting measurement resolution of the detected signals, for example. Amplifier and processing stages that read and process the detected signals may add additional noise. Another source of noise may be fixed pattern noise from the sensor array, which also may make it increasingly difficult measure the detected signals.

SUMMARY OF THE INVENTION

In view of the foregoing background, it is therefore an object of the present invention to provide a finger biometric sensing device that compensates for the various noise sources.

This and other objects, features, and advantages in accordance with the present invention are provided by a finger biometric sensing device that may include drive circuitry capable of generating a drive signal and an array of finger biometric sensing pixel electrodes cooperating with the drive circuitry and capable of generating a detected signal based upon placement of a finger adjacent the array of finger biometric sensing pixel electrodes. The detected signal may include a relatively large drive signal component and a relatively small sense signal component superimposed thereon. At least one gain stage may be coupled to the array of finger biometric sensing pixel electrodes. The finger biometric sensing device may also include drive signal nulling circuitry coupled to the at least one gain stage capable of reducing the relatively large drive signal component from the detected signal. Accordingly, the finger biometric sensing device may compensate for the various noise sources, for example, by nulling the drive signal, which may increase measurement sensitivity while maintaining the drive signal at acceptable voltage levels.

The drive signal nulling circuitry may include a digital-to-analog converter (DAC) capable of generating an inverted scaled replica of the drive signal for the at least one gain stage, for example. The at least one gain stage may include a plurality thereof coupled together in series and defining a summing node between a pair of adjacent ones of the plurality of gain stages. The DAC may be coupled to the summing node, for example.

The drive signal nulling circuitry may include an inverting amplifier and at least one impedance coupled thereto capable of generating an inverted scaled replica of the drive signal for the at least one gain stage. The finger biometric sensing device may further include switching circuitry coupled to the array of finger biometric sensing pixel electrodes and the at least gain stage capable of sequentially generating output data for adjacent regions of the array of finger biometric sensing pixel electrodes, for example.

The drive circuitry may include a finger coupling electrode adjacent the array of finger sensing pixel electrodes, and a voltage generator coupled to the finger coupling electrode. The array of finger biometric sensing pixel electrodes and the at least one gain stage may have a circuit reference associated therewith, for example. The circuit reference may be coupled to a device ground so that the voltage generator drives the finger coupling electrode with respect to the circuit reference and the device ground. In another embodiment, the finger coupling electrode may be coupled to a device ground so that the voltage generator drives the circuit reference with respect to the finger coupling electrode and the device ground.

The finger biometric sensing device may further include a dielectric layer covering the array of finger sensing pixel electrodes. The finger sensing device may also further include an analog-to-digital converter (ADC) downstream from the at least one gain stage. The drive circuitry may be capable of generating a square wave at an amplitude in a range of 10 to 20 volts and at a frequency in a range of 1 to 5 MHz, for example.

A method aspect is directed to a method of reducing a relatively large drive signal in a finger biometric sensing device that includes drive circuitry capable of generating a drive signal, an array of finger biometric sensing pixel electrodes cooperating with the drive circuitry and capable of generating a detected signal based upon placement of a finger adjacent the array of finger biometric sensing pixel electrodes. The detected signal may include a relatively large drive signal component and a relatively small sense signal component superimposed thereon. The finger biometric sensing device may include at least one gain stage coupled to the array of finger biometric sensing pixel electrodes. The method may include operating drive signal nulling circuitry coupled to the at least one gain stage to reduce the relatively large drive signal component from the detected signal.

DETAILED DESCRIPTION

Figure 1:
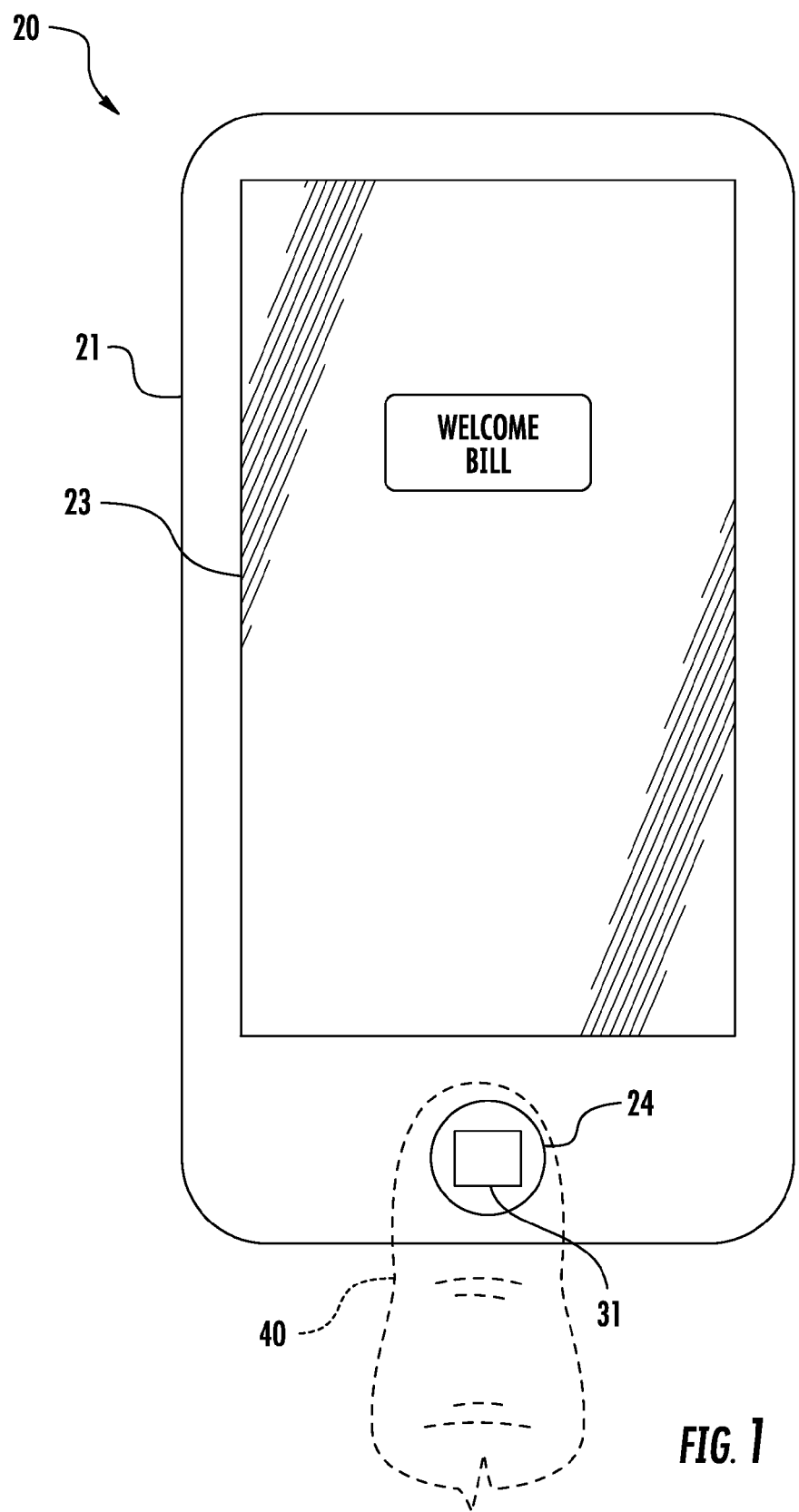
FIG. 1 is a plan view of an electronic device according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Referring initially to FIGS. 1-4, an electronic device 20 is now described. The electronic device 20 illustratively includes a portable housing 21 and a processor 22 carried by the portable housing. The electronic device 20 is illustratively a mobile wireless communications device, for example, a cellular telephone. The electronic device 20 may be another type of electronic device, for example, a tablet computer, laptop computer, etc. In some embodiments, the electronic device 20 may be an integrated circuit for use with another or host electronic device.

Wireless communications circuitry 25 (e.g. a wireless transceiver, cellular, WLAN Bluetooth, etc.) is also carried within the housing 21 and coupled to the processor 22. The wireless transceiver 25 cooperates with the processor 22 to perform at least one wireless communications function, for example, for voice and/or data. In some embodiments, the electronic device 20 may not include a wireless transceiver 25.

A display 23 is also carried by the portable housing 21 and is coupled to the processor 22. The display 23 may be a liquid crystal display (LCD), for example, or may be another type of display, as will be appreciated by those skilled in the art. A device memory 26 is also coupled to the processor 22.

A finger-operated user input device, illustratively in the form of a pushbutton switch 24, is also carried by the portable housing 21 and is coupled to the processor 22. The pushbutton switch 24 cooperates with the processor 22 to perform a device function in response to the pushbutton switch. For example, a device function may include a powering on or off of the electronic device 20, initiating communication via the wireless communications circuitry 25, and/or performing a menu function.

More particularly, with respect to a menu function, the processor 22 may change the display 23 to show a menu of available applications based upon pressing of the pushbutton switch 24. In other words, the pushbutton switch 24 may be a home switch or button, or key. Of course, other device functions may be performed based upon the pushbutton switch 24. In some embodiments, the finger-operated user input device 24 may be a different type of finger-operated user input device, for example, forming part of a touch screen display. Other or additional finger-operated user input devices may be carried by the portable housing 21.

The electronic device 20 includes a finger biometric sensing device 50, which may be in the form of one or more integrated circuits (ICs). The finger biometric sensing device 50 includes an array of finger biometric sensing pixel electrodes 31 that is carried by the pushbutton switch 24 to sense a user's finger 40 or an object placed adjacent the array of finger biometric sensing pixel electrodes. The array of finger biometric sensing pixel electrodes 31 is carried by the pushbutton switch 24 so that when a user or object contacts and/or presses downward on the pushbutton switch, data from the user's finger 40 is acquired, for example, for finger matching and/or spoof detection, as will described in further detail below. In other words, the array of finger biometric sensing pixel electrodes 31 may cooperate with circuitry, as will be explained in further detail below, to be responsive to static contact or placement of the user's finger 40 or object. Of course, in other embodiments, for example, where the array of finger biometric sensing pixel electrodes 31 is not carried by a pushbutton switch, the array of finger biometric sensing pixel electrodes may cooperate with circuitry to be responsive to sliding contact (i.e. a slide sensor), or responsive to static placement (i.e. a standalone static placement sensor).

The array of finger biometric sensing pixel electrodes 31 is illustratively an 88×88 array of finger sensing pixel electrodes. In other words, conceptually, the array of can be organized into 88 rows of 88 pixels and defines a rectangle. Of course, in some embodiments, the array of finger biometric sensing pixel electrodes 31 may be a different size. Each finger sensing pixel electrode 35 may define an electric field sensing pixel such as disclosed in U.S. Pat. No. 5,940,526 to Setlak et al., assigned to the present assignee, and the entire contents of which are herein incorporated by reference. Of course, in some embodiments, each finger biometric sensing pixel electrode 35 may define another type of finger biometric sensing pixel.

The processor 22 may also cooperate with the array of finger biometric pixel sensing electrodes 31 to determine a finger match based upon finger biometric data. More particularly, the processor 22 may determine a finger match based upon enrollment data stored it the device memory 26. The processor 22 may also determine a live finger based upon spoof data. More particularly, the processor 22 may determine a live finger based upon a complex impedance and/or bulk impedance measurement.

In some embodiments, the processor 22 may cooperate with the array of finger biometric pixel sensing electrodes 31 to perform a navigation function, for example. Of course the processor 22 may cooperate with the array of finger biometric sensing electrodes 31 and/or other circuitry to perform other or additional functions, as will be appreciated by those skilled in the art.

The finger biometric sensing device 50 also includes switching circuitry 32 coupled to the array of finger sensing pixel electrodes 31 and the gain stages 60a-60d. The switching circuitry 32 is capable of acquiring finger biometric data from each of a plurality of sub-arrays 33a-33f of the array of finger biometric sensing pixel electrodes 31. More particularly, the switching circuitry 32 is capable of sequentially generating output data for adjacent regions of the array of finger biometric sensing pixel electrodes 31 or sub-arrays 33a-33f. In an 88×88 finger biometric pixel sensing electrode array, there are 7744 finger biometric sensing pixel electrodes 35 and 7744 corresponding switches. Of course, additional switches may be used, as will be appreciated by those skilled in the art.

The finger biometric sensing device 50 also includes drive circuitry 44 capable of generating a drive signal coupled to the array of finger sensing pixel electrodes 31. The array of finger sensing pixel electrodes 31 cooperates with the drive circuitry 44 to generate a detected signal based upon placement of a finger 40 adjacent the array of finger sensing pixel electrodes. The gain stages 60a-60d are coupled together in series and define summing nodes 61a-61b between a pair of adjacent ones of the gain stages. A summing node 61c is coupled to the end of the fourth gain stage 60d.

The first gain stage 60a may be in the form of one or more variable gain amplifiers 63a defining front end amplifiers, each respectively coupled to a finger sensing pixel electrode 35 from the array of finger sensing electrodes 31. The first gain stage 60a is input with the detected signal at a raw signal level. An output of the first gain stage 60a is coupled to the first summing node 61a. For an 8-channel implementation (e.g., for an 88×88 array of finger sensing pixel electrodes divided into eleven 8×8 regions), there are 8 instances of the illustrated first gain stage 60a.

The second gain stage 60b may also be in the form of one or more variable gain amplifiers 63b defining AC amplifiers. Each amplifier 63b of the second gain stage 60b has an input coupled to the first summing node 61a. A capacitor 64 or other impedance device may be coupled between the first summing node 61a and the second gain stage 60b. The second gain stage 60b also processes the input signal at a raw signal level. For an 8-channel implementation (e.g., for an 88×88 array of finger sensing pixel electrodes divided into eleven 8×8 regions), there are 8 instances of the illustrated second gain stage 60b.

The third gain stage 60c may be in the form of one or more pairs of variable gain amplifiers 63c, 63d defining a correlated double sampler (CDS). More particularly, the third gain stage 60c may include odd and even variable gain amplifiers 63c, 63d for each channel. For an 8-channel implementation, there are 8 instances of the illustrated third gain stage 60c. The output of each of the odd and even variable gain amplifiers 63c, 63d of the third gain stage 60c are input to a multiplexer 66. As will be appreciated by those skilled in the art, the multiplexer 66 may be a 16:1 multiplexer for an 8 channel implementation. The output of the multiplexer 66 is summed, at the second summing node 61b, with an output from a second digital-to-analog converter (DAC) 72, which will be described in further detail below. The third gain stage 60c also processes the input signal at a raw signal level.

The fourth gain stage 60d may also be in the form of one or more variable gain amplifiers 63e. The variable gain amplifier 63e may have an input coupled to the second summing node 61b and an output coupled to the third summing node 61c. The fourth gain stage 60d processes the input signal at a feature signal level. Of course, while four gain stages 60a-60d are illustrated and described, there may be additional gain stages.

The drive circuitry 44 includes a finger coupling electrode 47 adjacent the array of finger sensing pixel electrodes 31. The drive circuitry 44 also includes a drive signal generator, which in the illustrated embodiment is in the form of a voltage generator 48, coupled to the finger coupling electrode 47. The array of finger sensing pixel electrodes 31 and the gain stages 60a-60d have a circuit reference 52 associated therewith. The circuit reference 52 is to be coupled to a device ground 53 so that the voltage generator 48 drives the finger coupling electrode 47 with respect to the circuit reference 52 and the device ground 53.

The finger biometric sensing device 50 also includes drive signal nulling circuitry 45 coupled to the gain stages 60a-60d. As will be appreciated by those skilled in the art, relatively high voltage drive signals may result in relatively large common mode voltages appearing on the detected signal generated from the array of finger biometric sensing pixel electrodes 31. Since the drive signal generally carries no useful information, it may be particularly desirable to reduce or eliminate it as early as possible in the signal chain. Specifically, small spatial variations in electric field intensity in the presence of a relatively large average field intensity may be measured.

The drive signal nulling circuitry 45 is capable of reducing the relatively large drive signal component from the detected signal. The drive signal nulling circuitry 45 includes digital-to-analog converter (DAC) 46 capable of generating an inverted scaled replica of the drive signal for the gain stages

60a-60d. More particularly, the DAC 46 is coupled to the first summing node 61a. A memory may be coupled to the DAC 46.

Figure 5:
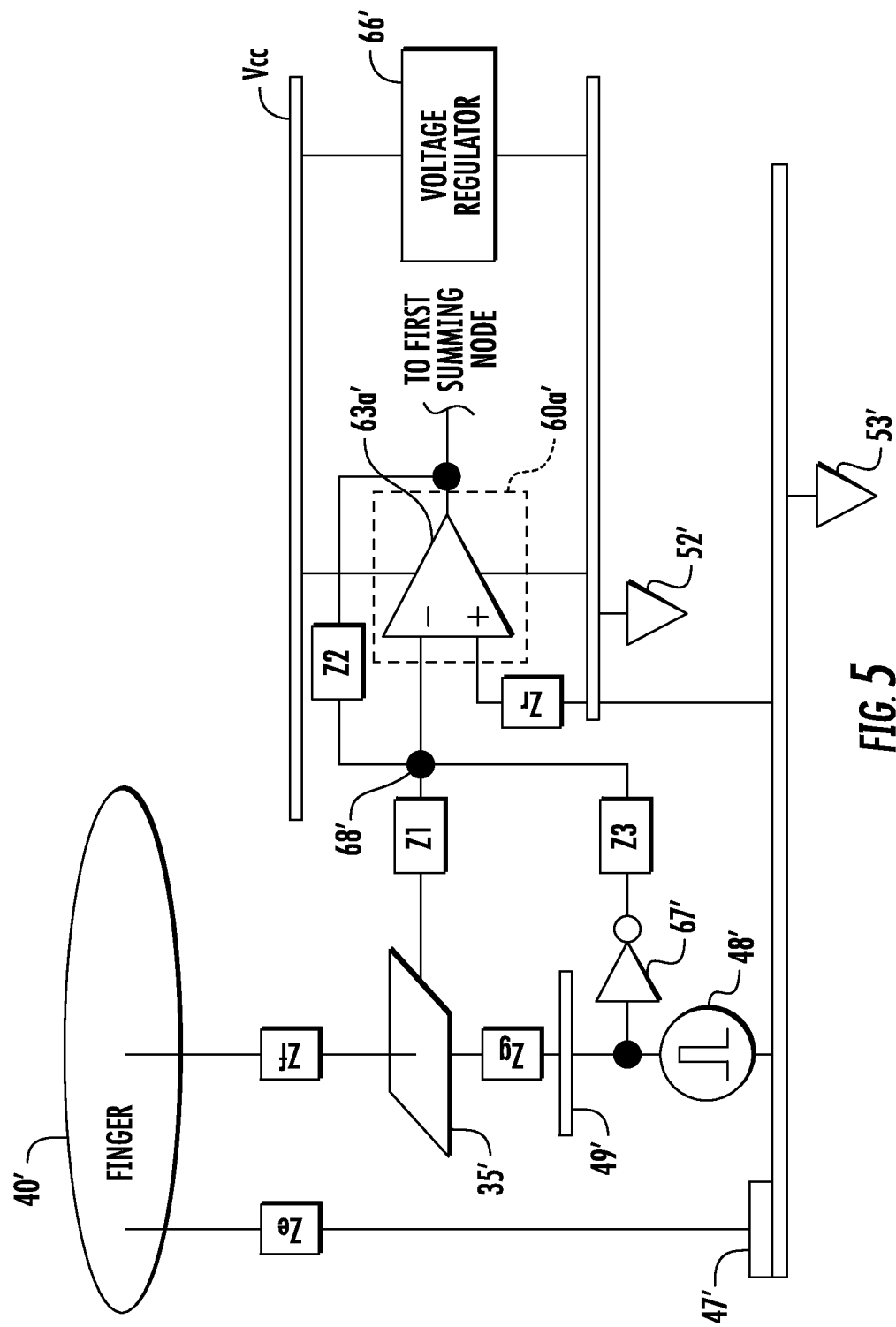
FIG. 5 is a schematic circuit diagram of a portion of drive signal nulling circuitry in accordance with another embodiment of the present invention.

In some embodiments, for example, as illustrated in FIG. 5, the drive signal nulling circuitry 45' includes an inverting amplifier 67' and impedances Z1, Z3 coupled thereto. In such a drive signal nulling system 45', the sense amplifier 63a' (i.e., first gain stage 60a'), which may be a differential amplifier, is configured as an operational amplifier summer. The summing node 68' is connected to the finger sensing pixel electrode 35' via the impedance Z1, which may be relatively large (e.g., a small capacitor) and to an inverted version of the pixel drive signal (the drive signal cancellation signal), also via a summing impedance. As will be appreciated by those skilled in the art, the summing impedances Z1, Z3 may be considered drive signal cancellation summing impedances. Other impedances also exist, for example, a finger coupling electrode impedance Ze coupled between the user's finger 40' and the finger coupling electrode 47', which in turn is coupled to a device ground 53'. A finger impedance Zf exists between the user's finger 40' and the finger biometric sensing pixel electrode 35', a reference impedance Zg between finger sensing biometric sensing pixel electrode and the substrate 49' of a first IC. A reference impedance Zr is coupled between the circuit ground 52' of a second IC and the non-inverting input of the amplifier 63a' also on the second IC. An impedance Z2 may also be coupled across the output and the inverting input of the amplifier 63a'. A voltage regulator 66' may also be coupled between the voltage supply Vcc and the circuit ground 52' which is coupled to the device ground 53' in the illustrated embodiment.

The large drive signal on the sensor plate of each finger sensing biometric sensing pixel electrode 35' and the drive cancellation signal balance at the current summing node 68' of the amplifier 63a' so that the signals at the amplifier are relatively low voltage signals with the relatively high voltage drive signal removed. In this embodiment, the components that may have high voltage capability are those that generate high voltage drive signals. None of the measurement circuitry may have high voltage capabilities. A potential disadvantage of this approach may include tracking of the drive signal cancellation signal to the sensor drive signal so that approximate balance is maintained at the sense amp summing nodes 68' under an increased amount of conditions.

Referring again to FIGS. 1-4, the drive circuitry 44 may be capable of generating a square wave at an amplitude in a range of 10 to 20 volts and at a frequency in a range of 1 to 5 MHz, for example. Of course, the drive circuitry 44 may be capable of generating a different type of wave having a different amplitude range and in a different frequency range, as will be appreciated by those skilled in the art. As will be appreciated by those skilled in the art, a relatively high voltage drive signal may be managed by floating the ground of the amplifier in the first gain stage 60a, i.e., sense amplifier 63a, and connecting it to the drive signal.

Figure 6:
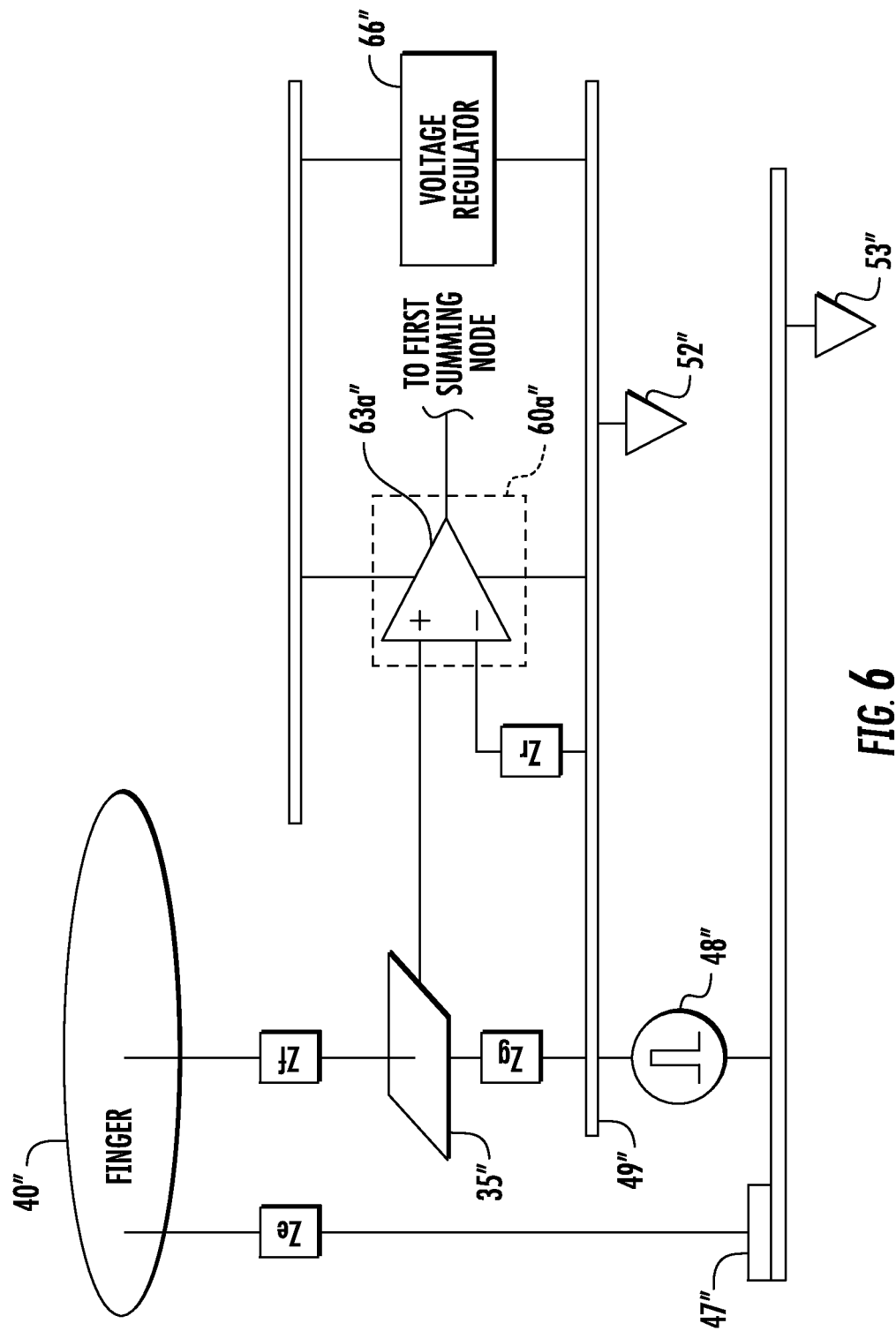
FIG. 6 is a schematic circuit diagram illustrating the finger coupling electrode coupled to the device ground in accordance with an embodiment of the present invention.

Referring now briefly to FIG. 6, in another embodiment, the finger coupling electrode 47" is coupled to a device ground 53" so that the voltage generator 48" drives the circuit reference 52" with respect to the finger coupling electrode and the device ground. A finger coupling electrode impedance Ze is defined between the user's finger 40" and the finger coupling electrode 47", which in turn, is coupled to the device ground 53'. A finger impedance Zf exists between the user's finger 40" and the finger biometric sensing pixel electrode 35". A reference impedance Zg exists between the finger biometric sensing pixel electrode and the substrate 49" of a first IC. A reference impedance Zr exists between the circuit ground 52" of a second IC and the non-inverting input of the amplifier 63a" also on the second IC. A voltage regulator 66" may also be coupled to between the voltage supply Vcc and the circuit ground 52" or device ground 53".

In contrast to driving the finger coupling electrode 47", the relatively high voltage drive signal may not be seen by the first gain stage 60a" or sense amplifier 63a" between its inputs and its ground. Small difference voltages may be visible to the first gain stage 60a" or sense amplifier 63a". However, an output signal from the sense amplifier 63a" may not be ground referenced, but rather is riding on top of the internal excitation signal or drive signal. Active level shifting circuitry may be applied in the subsequent signal path to remove the drive signal and generate a ground referenced output.

As will be appreciated by those skilled in the art, one benefit of this approach is that the drive signal may be easier to remove after a small ridge pattern signal has been amplified by the sense amplifier 63a". For example, the drive signal cancellation techniques discussed above may be easier to apply downstream of the sense amplifier 63a". This type of floating ground system may be implemented in a variety of ways discussed below.

One way of implementing a floating ground system as noted above is via a multi-chip or integrated circuit (IC) approach, for example, as illustrated in FIGS. 5 and 6. In this implementation high voltages are handled by one silicon die and the lower voltages by a second die. For some of the systems described above, for example, the substrates of the different die may also operate at different voltages. The system may be partitioned in a variety of different ways based upon relative costs of the different die. For example, in one embodiment, the drive signal generation and the array of finger biometric sensing pixel electrode circuitry are fabricated in a high voltage process, while the downstream signal processing and analog to digital conversion circuitry is fabricated in a low voltage process. Alternatively, in another embodiment, the array circuitry and signal processing circuitry may be fabricated in a low voltage process and run with a driven ground, while the drive signal generation and the data conversion and interfacing circuitry is fabricated in a high voltage process.

Another way of implementing a floating ground system is via a single chip. In this implementation, a high voltage IC fabrication process with low voltage device options is utilized for lower cost and increased efficiency performance. In particular, both the drive signal generation circuitry and sensing front end circuitry are implemented with high voltage technology components. An example of this system includes a P substrate tied to circuit ground and an N+ buried layer and deep n well side wall junctions to isolate all active p well regions. A DC-to-DC boost converter is implemented that takes typically a 1.8/3.3V supply input and generates a 15-20V output. This output voltage is connected to all the N+ buried layers and n well side wall junctions for reverse bias relative to all active p well regions. An appropriate drive circuit (e.g. buffer) couples to this boost output voltage and drives the p well regions of the frontend sensing circuits. This may include pixel and multiple frontend amplifier stages. The signals from these frontend amplifiers are then appropriately conditioned (e.g. ac coupled, level shifted, etc., for example, using the techniques described above) before they are connected to lower voltage signal processing circuitry. The p well regions of these lower voltage circuits are connected to circuit ground. In the same way, digital circuits involved in digital signal processing, control, memory, etc. have their p well regions connected to circuit ground. Recall that all circuit regions are isolated by the high voltage N+ buried layer and n well side wall junctions which are tied to the highest potential from the boost converter.

The advantages of this implementation with respect to systems using two separate silicon die may be that a single part has signal generation and sensing included. Moreover, only the frontend sensing circuitry is driven by the boosted high voltage signal instead of the entire die, which may be particularly advantageous since a smaller driven area may lower power and reduce potential interference issues, and synchronization of finger drive and control signals may be simplified as all are on-chip with lower parasitics. Additionally, an external digital interface may not be implemented in a special fashion thus allowing for continuous die control from the host processor which may be particular advantageous for navigation applications. Still further, overall system noise may be lowered as power is lower and interfacing is simplified.

Figure 2:
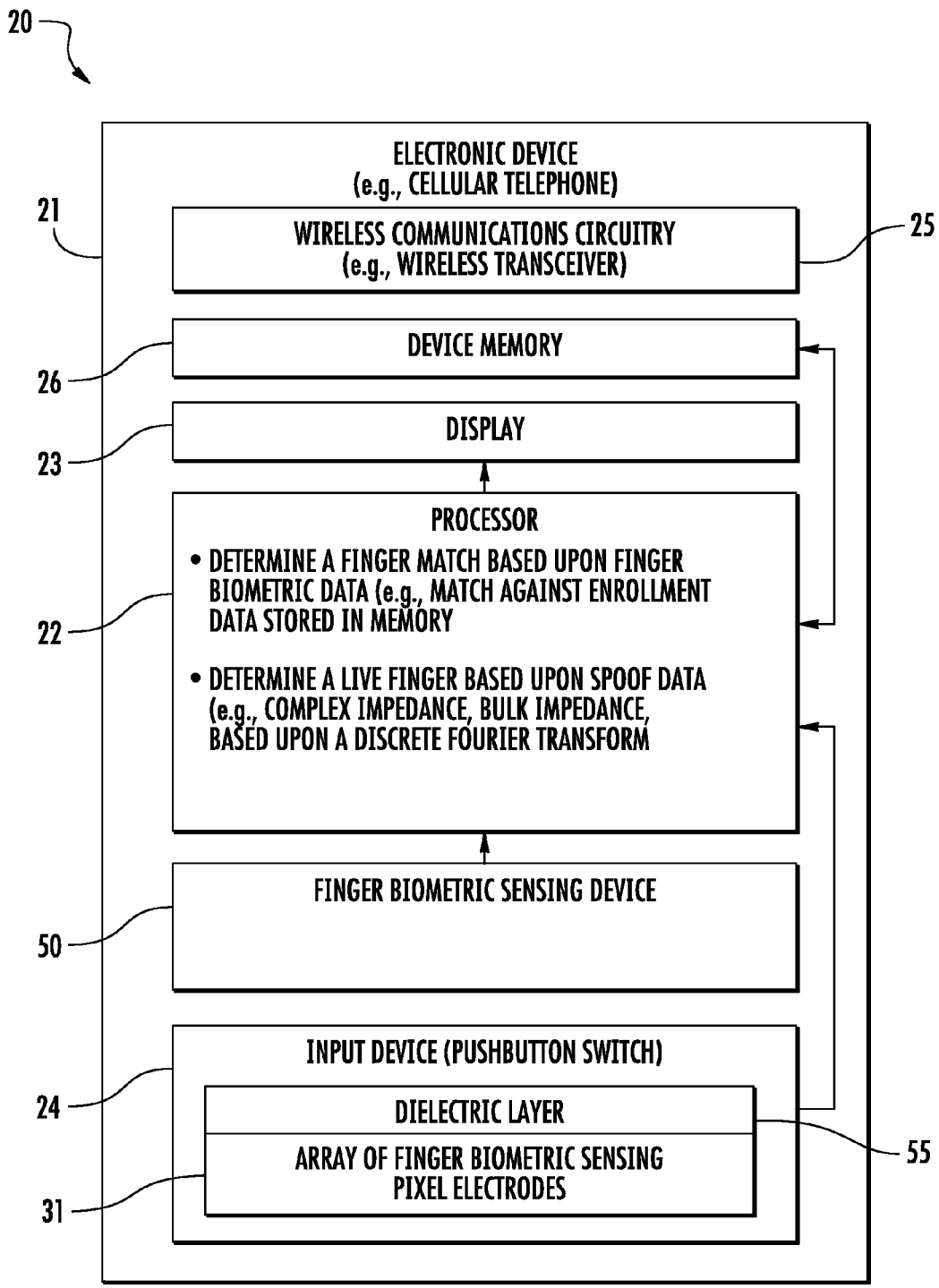
FIG. 2 is a schematic block diagram of the electronic device of FIG. 1.
Figure 3:
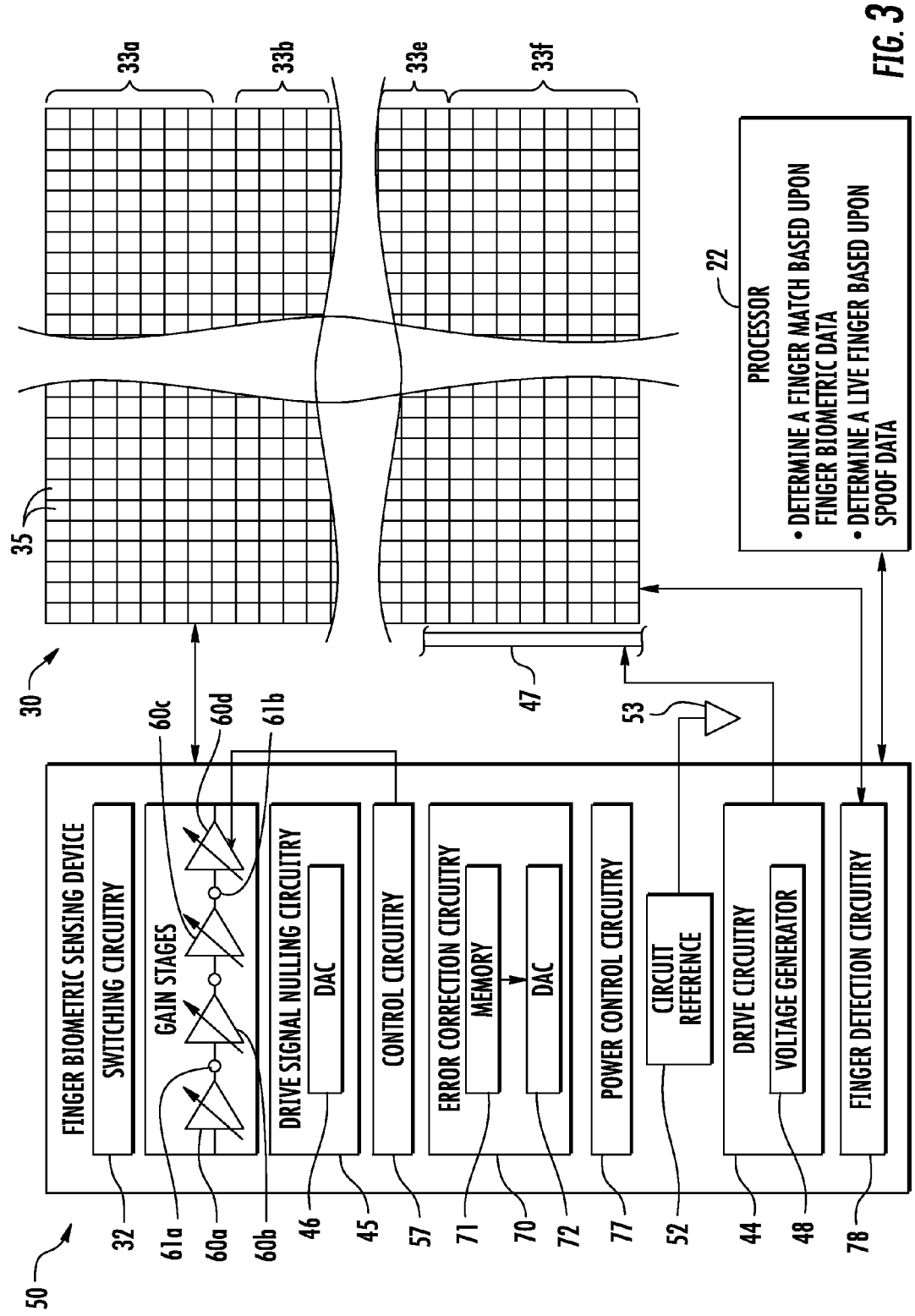
FIG. 3 is a more detailed schematic block diagram of a portion of the electronic device of FIG. 1.
Figure 4:
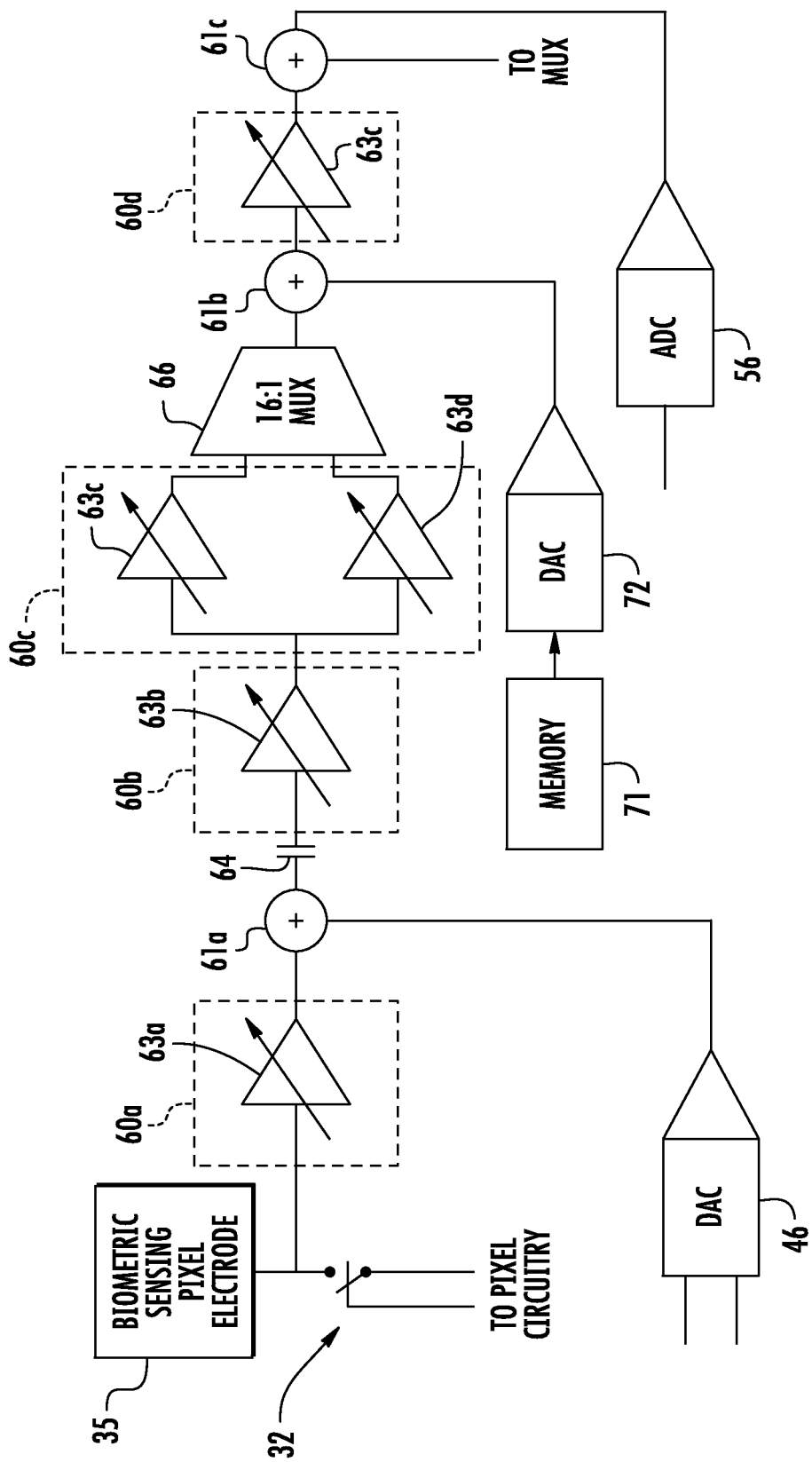
FIG. 4 is schematic circuit diagram of a portion of the electronic device of FIG. 1.

The finger biometric sensing device 50 may also include a dielectric layer 55 covering the array of finger sensing pixel electrodes 31 (FIG. 2). An output analog-to-digital converter (ADC) 56 may be coupled downstream from the gain stages 60*a*-60*d*. More particularly, the output ADC 56 may be coupled to the fourth gain stage 60*d* and may have a dynamic range. In some embodiments, a memory may be coupled to the ADC 56. Control circuitry 57 is capable of adjusting the fourth gain stage 60*d*, and in some embodiments, other and/or additional gain stages so that an output thereof is within the dynamic range of output ADC 57.

The finger biometric sensing device 50 may further include error compensation circuitry 70. The error compensation circuitry 70 may include a memory 71 capable of storing error compensation data and the second digital-to-analog converter (DAC) 72 cooperating with the memory and coupled to the second summing node 61*b* between the third and fourth gain stages 60*c*, 60*d*. The second DAC 72 may be capable of compensating for at least one error based upon the stored error compensation data. In particular, the memory 71 may be capable of storing error compensation data to account for tilt errors. Alternatively or additionally, where the dielectric layer 55 has a non-uniform thickness, the memory 71 may be capable of storing error compensation data to account for non-uniform thickness errors. For example, the dielectric layer 55 may have a larger thickness in one location than in another location and may vary between 100 μm-500 μm. This may be a result of the manufacturing process, for example, or may be intentional, for example, where a curved shape dielectric layer 55 is desired. For example, for a concave shaped dielectric layer 55, the change in thickness of the dielectric material above the array of finger sensing pixel electrodes 31 or sensor die may cause the detected signal to vary in both offset and amplitude.

This variation in offset and amplitude may be compensated in the digital domain by applying a digital offset and gain to the detected signal or sensor data. The compensation values may be stored in a table (i.e., look-up table) in the memory 71. In an extreme case, for example, each finger biometric pixel electrode 35 may have a unique offset and gain. Correction values from the memory 71 would be applied to a number of pixels in a local region (i.e. applied for some number of rows and columns).

Another approach to compensating for offset and amplitude variations may be to measure local minimum and maximum values and apply linear interpolation between the measured features. For example, even with a flat dielectric layer 55 or surface, tilt or pressure gradients can cause a gradient to be introduced in the measured levels of the detected signal. First and second voltages are used to calculate the local digital gain and offset (G1, O1) that are to be applied to increase the signal in the dynamic range of the output data. Third and fourth voltages are used to calculate the desired local digital gain and offset (G2, O2). Using a linear interpolation between the measured values (such that the values start with G1, O1 and linearly increase or decrease to G2, O2) removes the gradient in the signal level. A variation of this may also be used to compensate for measurement channel differences, for example, at the same time.

In one example, consider a four channel system where channel 1 is used to acquire data from column 1 in each row, channel 2 is for column 2, channel 3 is for column 3, and channel 4 is for column 4. Applying a linear interpolation independently along each column, for example, reduces or may remove gradients and channel-to-channel gain and offset differences without an additional processing step. Of course, in some embodiments, channel-to-channel noise may be removed by using a single channel.

The memory 71 may also be capable of storing error compensation data to account for fixed pattern noise errors. As will be appreciated by those skilled in the art, as imaging distances increase, for example, between a user's finger 40 and the array of finger biometric sensing pixel electrodes, (by way of the dielectric layer 55, for example), fixed pattern noise also increasingly becomes problematic. To account for this, compensation data accounting for the fixed pattern noise may be loaded into the memory 71 during production.

The memory 71 may further be capable of storing error compensation data to account for a gain stage offset error. As will be appreciated by those skilled in the art, when using series coupled gain stages, DC offset voltages may be added at each gain stage. Thus, it may be typically desirable to address these DC offset voltages across the gain stages.

The memory 71 may further be capable of storing error compensation data to account for pixel-to-pixel variation. More particularly, pixel-to-pixels differences or deltas may be particularly visible in a noise floor at a relatively high gain. Offsets between the pixels may be measured at the high gain setting. The difference or delta between the smallest offset with respect to the rest of the array is measured. This result may be scaled based upon the current gain settings of the gain stages 60*a*-60*d* and stored in the memory 71 as compensation data. It will be appreciated that in some embodiments, an additional memory may be coupled to other and/or additional components and/or store other or additional compensation data.

As will be appreciated by those skilled in the art, error compensation, for example, gain control, may be particularly advantageous to increase contrast and reduce saturation. In some embodiments, error compensation, for example, gain control, may operate either globally or regionally. With respect to global gain control samples are taken from the center of the array of finger sensing pixel electrodes and used to determine the setting of the gain stages 60*a*-60*d* and the DAC 72. The same gain and DAC settings may be used to acquire each region. With respect to regional gain control, samples are taken from the region being acquired to determine the settings of each gain stage 60*a*-60*d* and the DAC 72. The gain and DAC settings are applied for that region and are typically different from region to region.

In some embodiments, initial gain settings may be based upon previous gain settings. For regionally based gain compensation, the initial settings for a given region in a given sub-array may be based upon a previous region, with the exception of a first region, which may be based on the first region in the previous sub-array, for example. For globally based gain compensation, the initial setting may be based upon the previous frame settings. However, in either case, the initial settings may be the based upon the previous values of the DAC 72 and the previous gain index minus one.

Additionally, as will be appreciated by those skilled in the art, in addition to the circuitry described above, power control circuitry 77 may also be included for control and management of the power. The power control circuitry 77 may be particularly advantageous in portable or battery powered electronic devices, for example.

Finger detection circuitry 78 may also be included and coupled to the power control circuitry 77. The finger detection circuitry 78 may detect the presence of a user's finger 40 adjacent the array of finger biometric sensing pixel electrodes 31. The finger detection circuitry 78 may cooperate with the power control circuitry 77 to power other circuitry, for example, as described above, based upon detection of a user's finger. As will be appreciated by those skilled in the art, the finger detection circuitry 78 may be based upon a frequency based finger detection technique and/or an image based finger detection technique. Of course, other or additional techniques may be used.

A method aspect is directed to a method of reducing a relatively large drive signal in a finger biometric sensing device 50 that includes drive circuitry 44 capable of generating a drive signal an array of finger biometric sensing pixel electrodes 31 cooperating with the drive circuitry and capable of generating a detected signal based upon placement of a finger adjacent the array of finger biometric sensing pixel electrodes. The detected signal includes a relatively large drive signal component and a relatively small sense signal component superimposed thereon. The finger biometric sensing device 50 includes gain stages 60a-60d coupled to the array of finger sensing biometric pixel electrodes 31. The method includes operating drive signal nulling circuitry 45 coupled to the gain stages 60a-60d to reduce the relatively large drive signal component from the detected signal.

Another method aspect is directed to a method of error compensation in a finger biometric sensing device 50 that includes an array of finger biometric sensing pixel electrodes 31 and gain stages 60a-60d coupled to the array of finger biometric sensing pixel electrodes. The method includes using error compensation circuitry 70 that includes a memory 71 capable of storing error compensation data and a digital-to-analog converter (DAC) 72 cooperating with the memory and coupled to the at least one gain stage to compensate for at least one error based upon the stored error compensation data.

Yet another method aspect is directed to a method of making an electronic device 20 that includes circuitry carried by a housing 21 that has a device ground 53 associated therewith. An array of finger biometric sensing pixel electrodes 31 is also carried by the housing 21 and has a circuit reference 52 associated therewith. The method includes coupling a finger coupling electrode 47 adjacent the array of finger biometric sensing pixel electrodes 31 to the device ground 53 and coupling a drive signal or voltage generator 48 between the device ground 53 and the circuit reference 52.

Figure 7:
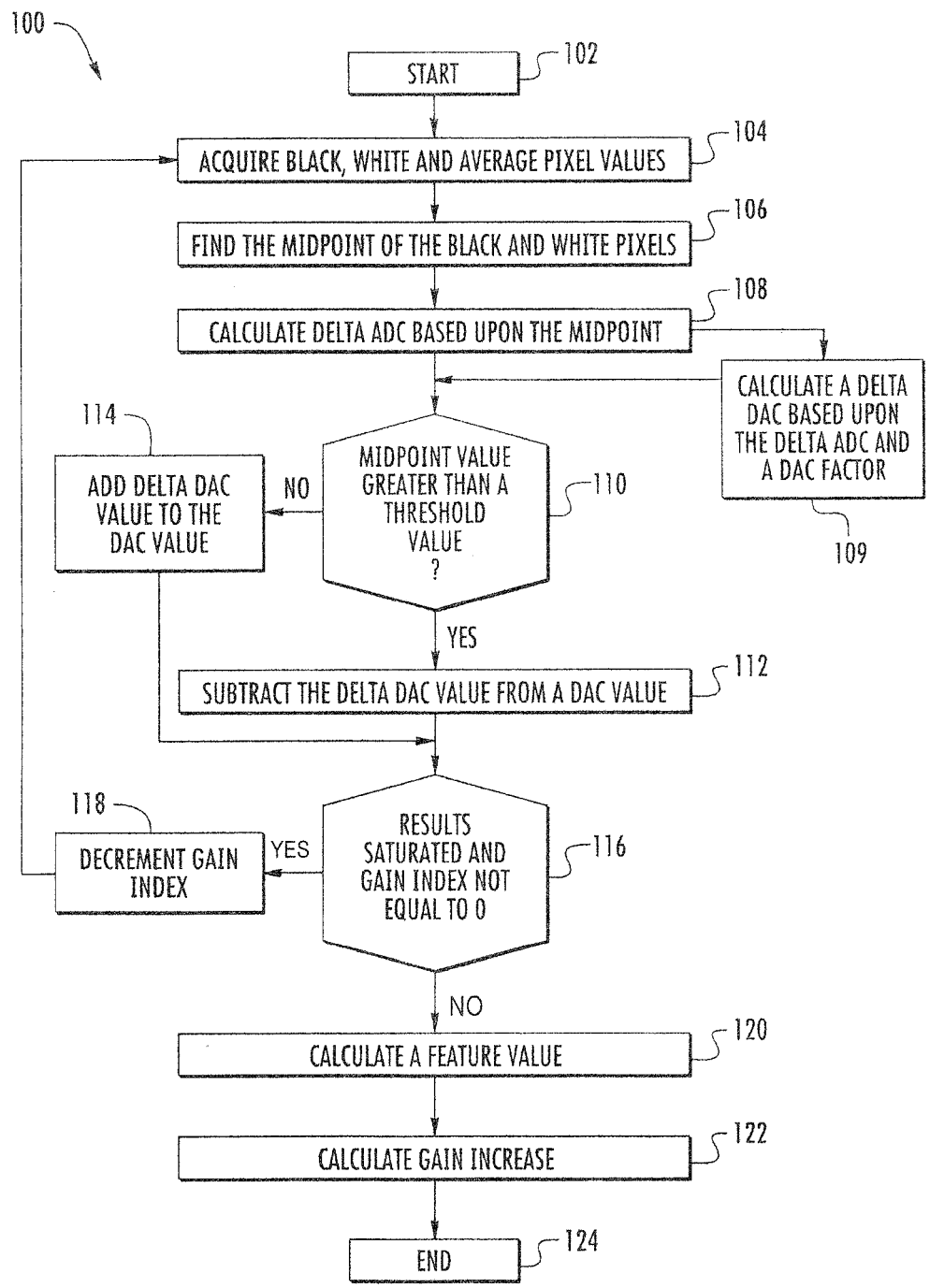
FIG. 7 is a flow chart of a detailed method of error compensation in accordance with an embodiment of the present invention.

Referring now to the flowchart 100 in FIG. 7, a more detailed error compensation method is now described. Beginning at Block 102, the method includes adjusting the setting of the DAC 72, the second gain stage 60b, and the third gain stage 60c. More particularly, at Block 104, the method includes acquiring black, white, and average pixel values. At Block 106, the method includes finding the midpoint of the black and white pixels, or the largest and smallest pixel values. In some embodiments, the fourth largest and smallest pixel values may be used to allow for some tolerance for bad pixels, as will be appreciated by those skilled in the art. A delta ADC value is calculated at Block 108 and may be based upon a midpoint of the value of the largest and smallest pixel value. The method includes calculating the delta DAC value based upon the delta ADC value and a DAC factor (Block 109). If, as determined at Block 110, the midpoint value is greater than a threshold value, for example 0x80, the delta DAC value is subtracted from a DAC value (Block 112). Otherwise, the delta DAC value is added to the DAC value (Block 114). The subtraction result is clamped to 0, and the addition result is clamped to 0x3FF. Of course, the results may be clamped to other values.

At Block 116, the results are checked for saturation, i.e., whether the black and white pixel values are 0 or 0xFF, for example. If the results are saturated and the gain index is not equal to 0, then the gain index is decremented (Block 118) and the method returns to Block 104.

At Block 120, the method includes calculating a feature value by subtracting the white pixel value from the black pixel value. A gain increase is calculated based upon a feature target value being divided by the feature value (Block 122). The memory 71, and more particularly, a look-up table in the memory is accessed with gain factors to determine the gain index increase. The method ends at Block 124.

Figure 8:
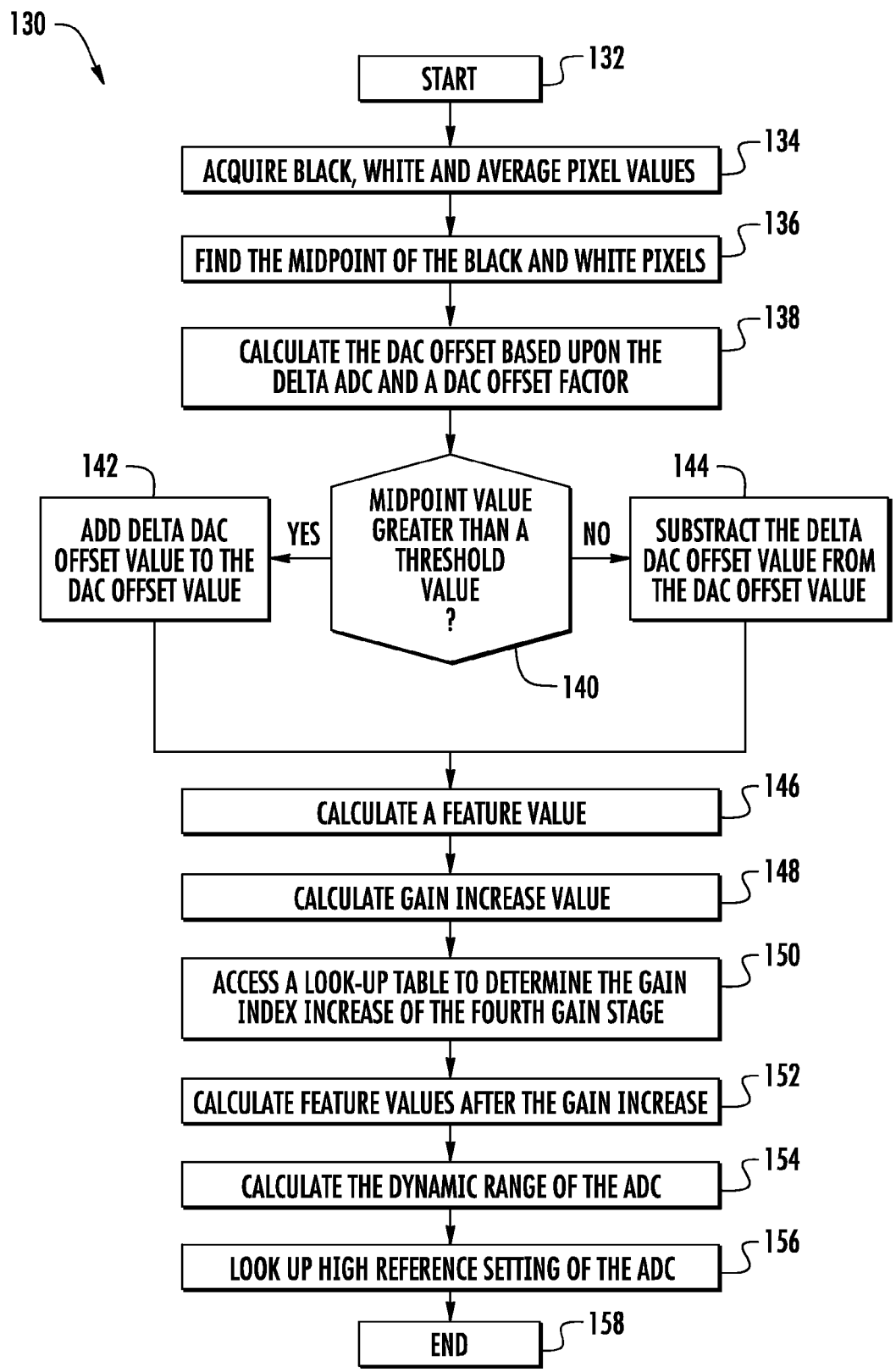
FIG. 8 is another flow chart of a detailed method of error compensation in accordance with an embodiment of the present invention.

Referring now to the flowchart 130 in FIG. 8, beginning at Block 132 a second series of steps adjust the DAC offset, the gain of the fourth gain stage 60d and the dynamic range of the ADC 56 (high voltage reference). At Block 134, the method includes acquiring black, white, and average pixel values. At Block 136, the method includes finding the midpoint of the black and white pixels, or the largest and smallest pixel values. In some embodiments, the fourth largest and smallest pixel values may be used to allow for some tolerance for bad pixels, as will be appreciated by those skilled in the art.

The method includes calculating the DAC offset based upon the delta ADC and a DAC offset factor (Block 138). The delta ADC may be based upon a midpoint of the value of the largest and smallest pixel value. If the midpoint value is greater than a threshold value, for example 0x80, (Block 140) the delta DAC offset value is added to the DAC offset value (Block 142). Otherwise, the delta DAC offset value is subtracted from the DAC offset value (Block 144). The subtraction result is clamped to 0, and the addition result is clamped to 0x3FF. Of course, the results may be clamped to other values.

At Block 146, the method includes calculating a feature value by subtracting the white pixel value from the black pixel value. A gain increase value is calculated based upon a second feature target value being divided by the feature value (Block 148). The memory 71, and more particularly, a look-up table in the memory is accessed with gain factors to determine the gain index increase of the fourth gain stage 60d (Block 150).

At Block 152, the feature values are calculated after a gain increase. The dynamic range of the ADC 56, and more particularly the high voltage reference, for obtaining a post gain feature value of the second feature target value is calculated (Block 154). The high reference setting to provide the high voltage reference of the ADC 56 is looked up in the memory 71 (Block 156). The method ends at Block 158.

An additional sample of pixel value data may be obtained to verify final settings, for example. This may also be used to make fine adjustments to the DAC offset and ADC dynamic range. If, for example, the final settings show saturation, it may be desirable to restart gain control process rather than attempt one or more fine adjustments. Restarting the gain control process may allow settings to be determined in three samples, while making fine adjustments to reduce saturation generally takes an indeterminate number of samples since the degree of saturation is unknown.

Additionally, while the device has been described with respect to two memories 26, 71, it will be appreciated by those skilled in the art that a single shared memory may be used, or other or additional memory devices may be used. Moreover, while different compensation techniques have been described herein, for example, with respect to drive signal compensation, tilt compensation, and gain compensation, it will be appreciated by those skilled in the art that any of the techniques may be used alone or in combination of any or all of the other compensation techniques. Other compensation techniques may also be used in conjunction with those described herein. The compensation techniques may be performed in parallel or serially, and may be processed by more than one processor, for example.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A finger biometric sensing device comprising:
   drive circuitry capable of generating a drive signal and comprising a finger coupling electrode to couple a drive signal to a finger and a voltage generator coupled to said finger coupling electrode;
   an array of finger biometric sensing pixel electrodes adjacent said finger coupling electrode, cooperating with said drive circuitry, and capable of generating a detected signal based upon placement of the finger adjacent said array of finger biometric sensing pixel electrodes, the detected signal including a relatively large drive signal component based upon the drive signal and a relatively small sense signal component superimposed thereon, the relatively small sense signal component comprising finger biometric characteristic data for performing an authentication function;
   at least one gain stage coupled to said array of finger biometric sensing pixel electrodes; and
   drive signal nulling circuitry coupled to said at least one gain stage capable of reducing the relatively large drive signal component from the detected signal.

2. The finger biometric sensing device according to claim 1 wherein said drive signal nulling circuitry comprises a digital-to-analog converter (DAC) capable of generating an inverted scaled replica of the drive signal for said at least one gain stage.

3. The finger biometric sensing device according to claim 2 wherein said at least one gain stage comprises a plurality thereof coupled together in series and defining a summing node between a pair of adjacent ones of said plurality of gain stages; and wherein said DAC is coupled to said summing node.

4. The finger biometric sensing device according to claim 1 wherein said drive signal nulling circuitry comprises an inverting amplifier and at least one impedance coupled thereto capable of generating an inverted scaled replica of the drive signal for said at least one gain stage.

5. The finger biometric sensing device according to claim 1 further comprising switching circuitry coupled to said array of finger biometric sensing pixel electrodes and said at least one gain stage capable of sequentially generating output data for adjacent regions of said array of finger biometric sensing pixel electrodes.

6. The finger biometric sensing device according to claim 1 wherein said array of finger biometric sensing pixel electrodes and said at least one gain stage have a circuit reference associated therewith; and wherein the circuit reference is to be coupled to a device ground so that said voltage generator drives said finger coupling electrode with respect to the circuit reference and the device ground.

7. The finger biometric sensing device according to claim 1 wherein said array of finger biometric sensing pixel electrodes and said at least one gain stage have a circuit reference associated therewith, and wherein said finger coupling electrode is to be coupled to a device ground so that said voltage generator drives the circuit reference with respect to said finger coupling electrode and the device ground.

8. The finger biometric sensing device according to claim 1 further comprising a dielectric layer covering said array of finger sensing pixel electrodes.

9. The finger biometric sensing device according to claim 1 further comprising an analog-to-digital converter (ADC) downstream from said at least one gain stage.

10. The finger biometric sensing device according to claim 1 wherein said drive circuitry is capable of generating a square wave at an amplitude in a range of 10 to 20 volts and at a frequency in a range of 1 to 5 MHz.

11. A finger biometric sensing device comprising:
    drive circuitry capable of generating a drive signal and comprising a finger coupling electrode to couple a drive signal to a finger and a voltage generator coupled to said finger coupling electrode;
    an array of finger biometric sensing pixel electrodes adjacent said finger coupling electrode, cooperating with said drive circuitry, and capable of generating a detected signal based upon placement of the finger adjacent said array of finger biometric sensing pixel electrodes, the detected signal including a relatively large drive signal component based upon the drive signal and a relatively small sense signal component superimposed thereon, the relatively small sense signal component comprising finger biometric characteristic data for performing an authentication function;
    a dielectric layer covering said array of finger biometric sensing pixel electrodes;
    at least one gain stage coupled to said array of finger biometric sensing pixel electrodes; and
    a digital-to-analog converter (DAC) capable of generating an inverted scaled replica of the drive signal for said at least one gain stage thereby reducing the relatively large drive signal component from the detected signal.

12. The finger biometric sensing device according to claim 11 wherein said at least one gain stage comprises a plurality thereof coupled together in series and defining a summing node between a pair of adjacent ones of said plurality of gain stages; and wherein said DAC is coupled to said summing node.

13. The finger biometric sensing device according to claim 11 wherein said drive signal nulling circuitry comprises an inverting amplifier and at least one impedance coupled thereto capable of generating an inverted scaled replica of the drive signal for said at least one gain stage.

14. The finger biometric sensing device according to claim 11 further comprising switching circuitry coupled to said array of finger biometric sensing pixel electrodes and said at least one gain stage capable of sequentially generating output data for adjacent regions of said array of finger sensing pixel electrodes.

15. The finger biometric sensing device according to claim 11 wherein said array of finger biometric sensing pixel electrodes and said at least one gain stage have a circuit reference associated therewith, and wherein the circuit reference is to be coupled to a device ground so that said voltage generator drives said finger coupling electrode with respect to the circuit reference and the device ground.

16. The finger biometric sensing device according to claim 11 wherein said array of finger biometric sensing pixel electrodes and said at least one gain stage have a circuit reference associated therewith, and wherein said finger coupling electrode is to be coupled to a device ground so that said voltage generator drives the circuit reference with respect to said finger coupling electrode and the device ground.

17. The finger biometric sensing device according to claim 11 further comprising an analog-to-digital converter (ADC) downstream from said at least one gain stage.

18. The finger biometric sensing device according to claim 11 wherein said drive circuitry is capable of generating a square wave at an amplitude in a range of 10 to 20 volts and at a frequency in a range of 1 to 5 MHz.

19. A method of reducing a relatively large drive signal in a finger biometric sensing device comprising drive circuitry capable of generating a drive signal and comprising a finger coupling electrode to couple a drive signal to a finger and a voltage generator coupled to the finger coupling electrode, and an array of finger biometric sensing pixel electrodes adjacent the finger coupling electrode, cooperating with the drive circuitry, and capable of generating a detected signal based upon placement of the finger adjacent the array of finger biometric sensing pixel electrodes, the detected signal including a relatively large drive signal component based upon the drive signal and a relatively small sense signal component superimposed thereon, the relatively small sense signal component comprising finger biometric characteristic data for performing an authentication function, and at least one gain stage coupled to the array of finger sensing biometric pixel electrodes, the method comprising:

operating drive signal nulling circuitry coupled to the at least one gain stage to reduce the relatively large drive signal component from the detected signal.

20. The method according to claim 19 wherein operating the drive signal nulling circuitry comprises operating a digital-to-analog converter (DAC) to generate an inverted scaled replica of the drive signal for the at least one gain stage.

21. The method according to claim 20 wherein the at least one gain stage comprises a plurality thereof coupled together in series and defining a summing node between a pair of adjacent ones of the plurality of gain stages; and wherein the DAC is coupled to the summing node.

22. The method according to claim 19 wherein operating the drive signal nulling circuitry comprises operating an inverting amplifier and at least one impedance coupled thereto to generate an inverted scaled replica of the drive signal for the at least one gain stage.

23. The method according to claim 19 further comprising using switching circuitry coupled to the array of finger biometric sensing pixel electrodes and the at least one gain stage to sequentially generate output data for adjacent regions of the array of finger biometric sensing pixel electrodes.

\* \* \* \* \*